United States Patent [19]

Consiglio

[11] Patent Number: 5,519,327

[45] Date of Patent: May 21, 1996

[54] PULSE CIRCUIT USING A TRANSMISSION LINE

[75] Inventor: Rosario J. Consiglio, San Jose, Calif.

[73] Assignee: VLSI Technology, Inc., San Jose, Calif.

[21] Appl. No.: 258,158

[22] Filed: Jun. 10, 1994

[51] Int. Cl.⁶ .................................................. G01R 27/26
[52] U.S. Cl. .......................... 324/678; 324/676; 324/765; 324/602; 333/20
[58] Field of Search .................................... 324/600, 602, 324/649, 522, 523, 534, 676, 678, 765, 766, 767; 333/20

[56] References Cited

PUBLICATIONS

"ESD On CHMOS Devices—Equivalent Circuits, Physical Models And Failure Mechanisms" by N. Khurana, T. Maloney, W. Yeh, Sep. 1985 Intel Corporation IEEE/IRPS, pp. 212–223.

Primary Examiner—Kenneth A. Wieder
Assistant Examiner—Diep Do
Attorney, Agent, or Firm—Patrick T. King

[57] ABSTRACT

A pulse discharge circuit for pulse testing an integrated-circuit device under test (DUT) is provided which uses three separate switching relays S1, S2, and S3, which are operated in a predetermined sequence. For charging the capacitance of a pulse-forming transmission line, the relay contact of S1 is closed while the relay contacts of relays S2, S3 are both open. For discharging the charge on the transmission line to form a test pulse, the relay contact of S1 is first opened, and the relay contact of S2 is then closed while the relay contact of S3 is open. After each test pulse is generated and applied to a DUT, the condition of the DUT is determined by a leakage current measurement. The relay contact S2 is opened to isolate the pulse generator circuit and then the relay contact S3 is closed.

14 Claims, 4 Drawing Sheets

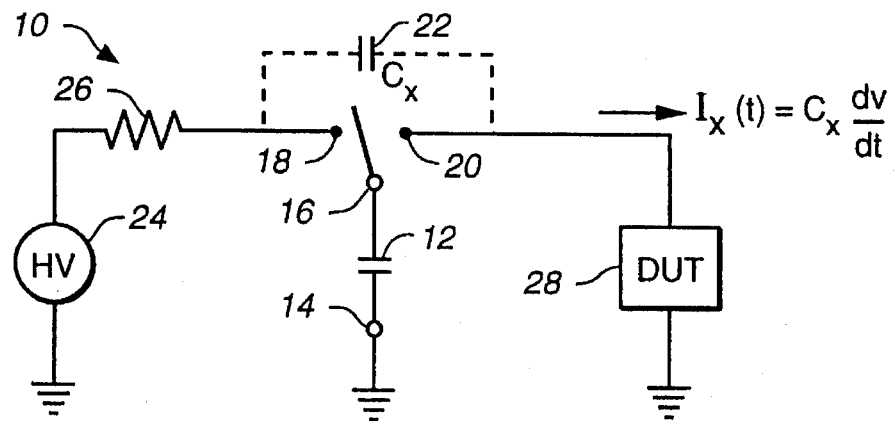
FIG._1A (PRIOR ART)
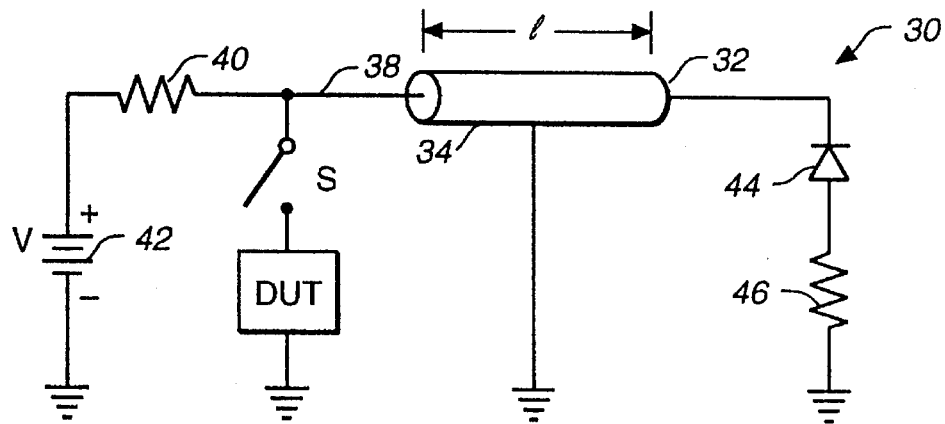
FIG._1B (PRIOR ART)
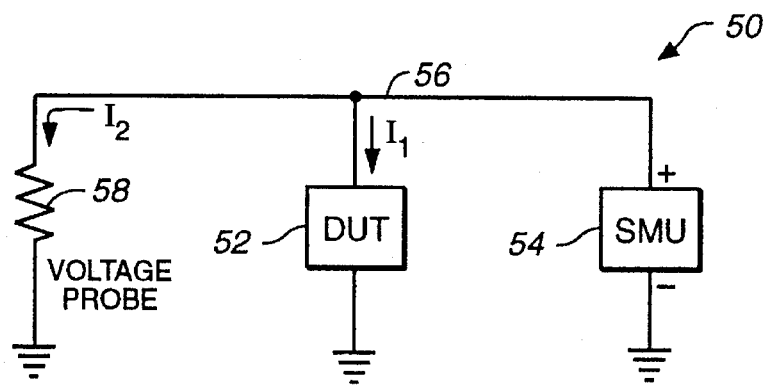
FIG._2 (PRIOR ART)

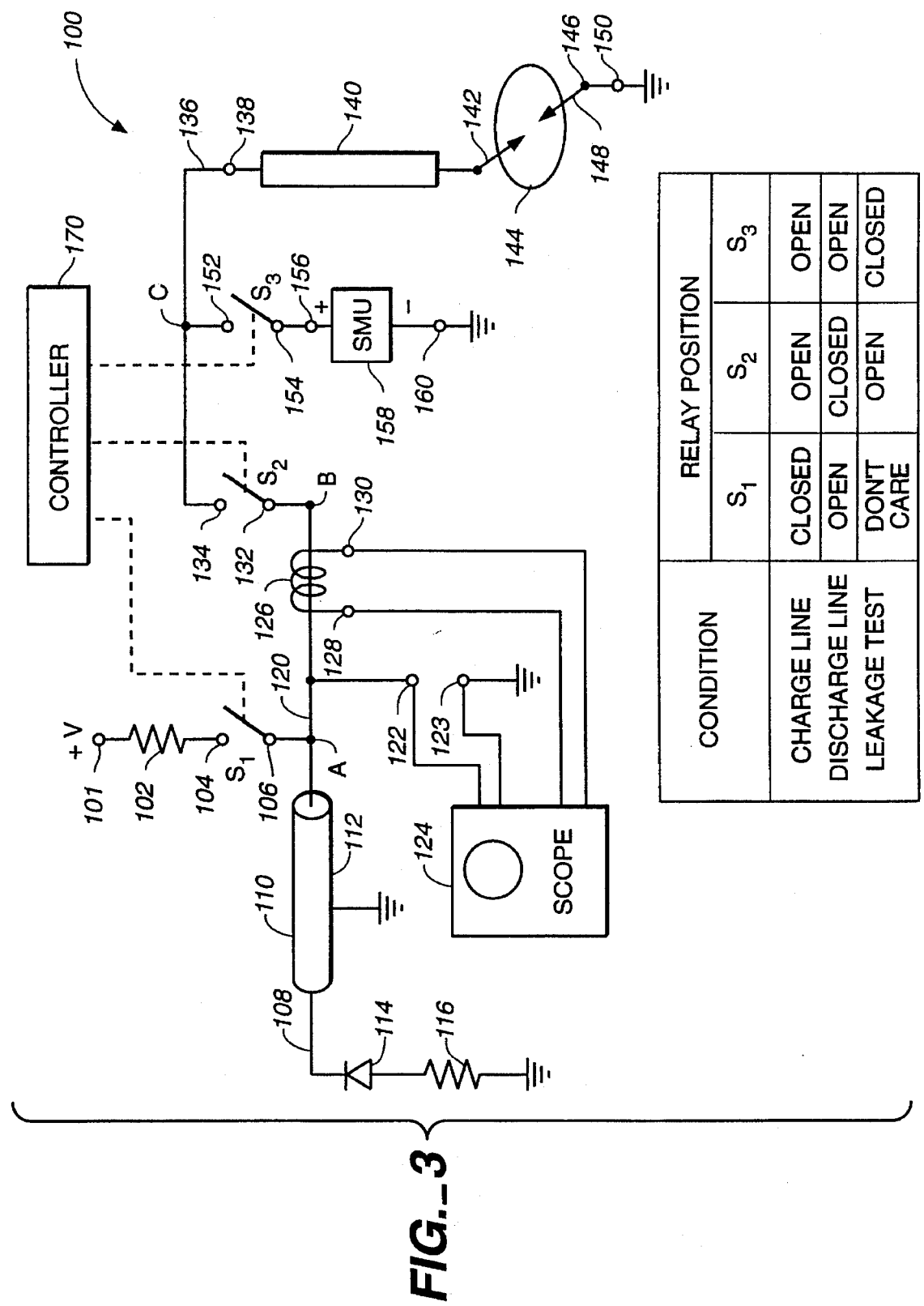
FIG._3

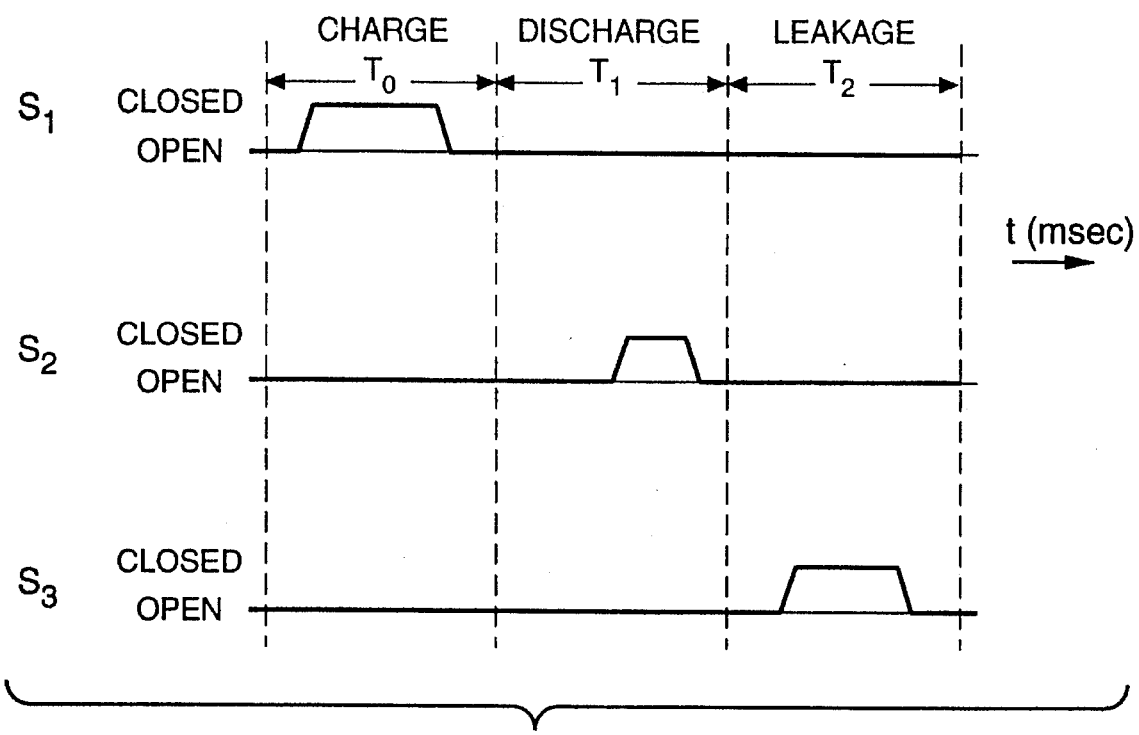
FIG._4
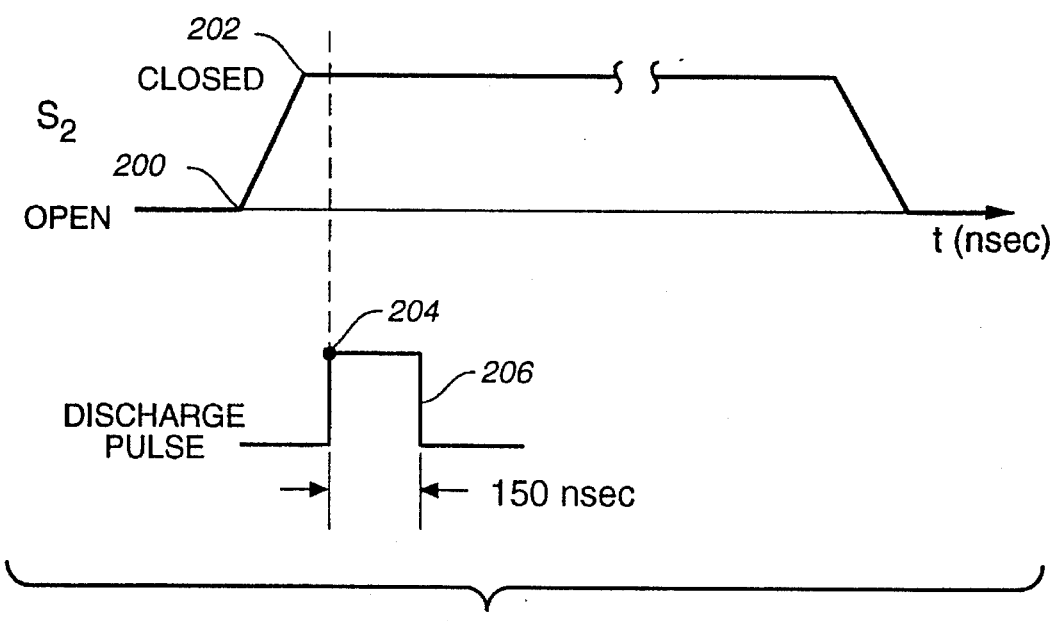
FIG._5

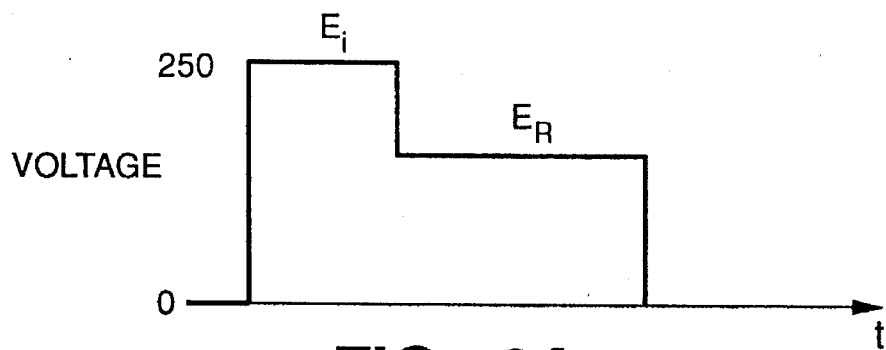
FIG._6A
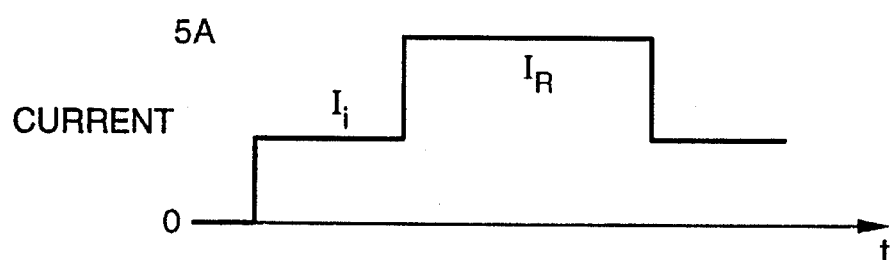
FIG._6B
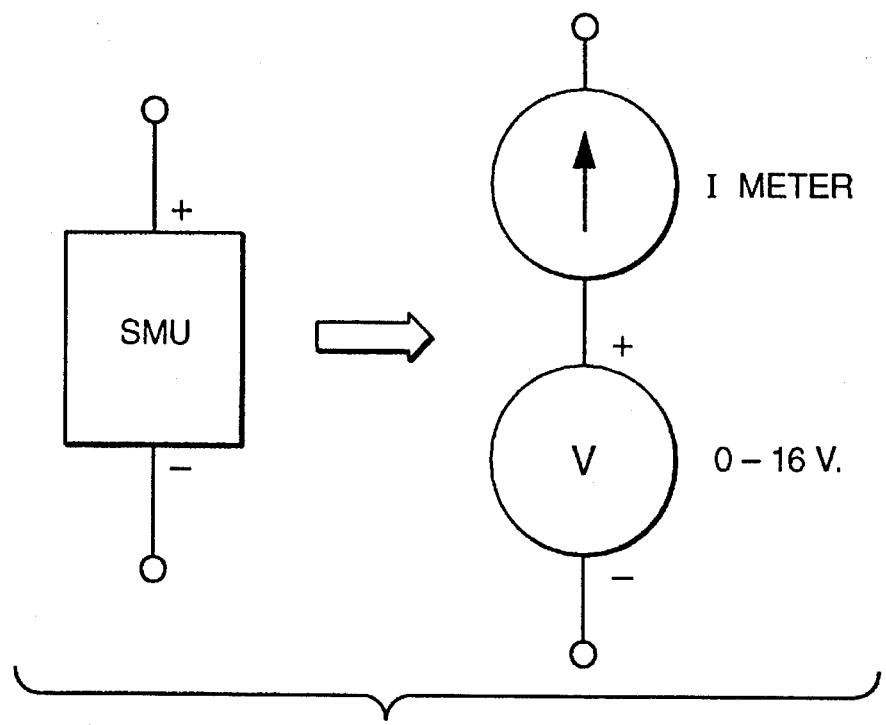
FIG._7

PULSE CIRCUIT USING A TRANSMISSION LINE

BACKGROUND OF THE INVENTION

1. Field of the Invention

This invention relates to test equipment for semiconductor devices and, more particularly, to a transmission-line pulser circuit for testing semiconductor devices.

2. Prior Art

A transmission line pulsing technique is used to generate short-duration, high current pulses to probe-test electrostatic discharge (ESD) performance of a semiconductor device. The transmission line pulsing technique charges the distributed capacitance of a transmission line and then discharges the line to produce a voltage pulse having a duration time equal to 2 l/c, where l is the length of the line and c is the propagation velocity of the transmission line.

In previous designs of transmission-line pulser test equipment for probe-testing of semiconductor devices, a so-called recharge transient problem has arisen. For the recharge transient problem, a charge-storing element, such as the capacitance of a transmission line, is switched between a high voltage source and a device under test (DUT). The transmission line, which provides the charge-storage capacitance, has one terminal connected to ground and its other terminal connected to the movable arm terminal of a double-pole, single-throw relay. One contact of the relay is connected to the high-voltage source through a high resistance and the other contact of the relay is connected to a probe connected to a device under test (DUT). A small shunt capacitance exists between the two relay contacts, so that, when the transmission line is connected to the high-voltage source to charge the charge-storage capacitance of the transmission line, the shunt capacitance across the relay contacts allows a displacement current to travel to the DUT. This displacement current is given by $I_x(t)=C_x\, dr/dr$, where $C_x$ is the small shunt capacitance across the two relay contacts. The effect of this is to put an uncontrolled amount of electrical stress on the DUT, which skews the effect of a subsequent test pulse.

Another problem associated with measurement of a DUT is the effect of leakage current caused by a voltage measurement probe used to measure voltage across the DUT. A constant voltage source forces a voltage on the DUT and the resultant leakage current through the DUT is then measured. The voltage probe measures the voltage applied by the constant voltage source across the DUT. If the resistance of the DUT is much greater than the resistance of the voltage probe, more current will flow through the lower resistance of the voltage probe than through the higher resistance of the DUT. As a result, the current flowing through the voltage probe will mask the leakage current through the DUT.

Consequently, the need has arisen for a technique for testing a semiconductor device which prevents relay recharge transients and which prevents voltage-probe leakage currents.

SUMMARY OF THE INVENTION

It is therefore an object of the invention to provide an improved transmission line pulser discharge circuit which avoids the recharge transient problem associated with the shunt capacitance across the contacts of a relay and to avoid the leakage problem associated with a separate voltage probe.

In accordance with this and other objects of the invention, a pulse discharge circuit for pulse testing an integrated-circuit device under test (DUT) is provided which uses three separate switches, such as the relays S1, S2, and S3, which are operated in a predetermined sequence.

The invention includes first means for electrically isolating a DUT from a transmission-line charging circuit; first means for initially connecting a high voltage source to a transmission line and providing a conductive path for charging the transmission line to a charged state; second means for subsequently electrically isolating the high voltage source from the charged transmission line; second means for connecting the charged transmission line, which is isolated from the high voltage source, to the integrated-circuit DUT and providing a pulse to said DUT; and means for measuring the reflected voltage and reflected current from the DUT.

The first means for electrically isolating the DUT from a transmission-line charging circuit includes a first relay in a first open position. The second means for connecting the charged transmission line to an integrated-circuit DUT and providing a pulse to the DUT includes the first relay in a second closed position.

The first means for initially connecting the high voltage source to the transmission line to provide a conductive path for charging the transmission line to a charged state includes a second relay in a first closed position. The second means for electrically isolating the high voltage source from the charged transmission line includes the second relay in a second open position.

Means are also provided for subsequently testing leakage of the DUT subsequent to a pulse being provided to the DUT to determine the condition of the DUT after the pulse has been applied. The means for subsequently testing leakage includes: means for isolating the transmission line from the DUT; means for connecting a sense measuring unit (SMU) to said DUT for providing a voltage and current to said DUT; and means for determining the voltage and current from the sense measuring unit to determine the leakage current of said DUT.

The means for isolating the transmission line from the DUT includes the first relay in the first open position. The means for connecting the sense measuring unit (SMU) to said DUT for providing a voltage and current to said DUT includes a third relay in a closed position.

The invention provides a pulse discharge system for testing an integrated-circuit device under test (DUT) includes a charging circuit, a discharge circuit for generating a test pulse, and a subsequently used sense measuring unit (SMU) for measuring the effect of the pulse on the DUT.

The charging circuit includes a high voltage (HV) terminal adapted to having a high voltage source connected thereto; a series resistor connected in series with said HV terminal; a first switch S1, having a first terminal connected in series with said series resistor and having a second terminal; a second switch S2, having a first terminal connected to the second terminal of the first switch and having a second terminal connected to a DUT; a transmission line having a first terminal connected to the second terminal of said first switch S1 and having a second terminal connected to a ground potential; means for opening the switch S1 to isolate the DUT; means for closing the switch S1 to charge the transmission line from the HV source and including means for opening the switch S1 to isolate the HV terminal from the transmission line.

The discharge circuit includes the charged transmission line; means for opening the first switch to isolate the transmission line from the HV terminal; the second switch S2; a probe connected to the second terminal of the second switch and having a point adapted to connect to a DUT; means for closing the switch S2 to connect the charged transmission line to the probe to provide a discharge pulse to the DUT; means for measuring the reflected voltage from the DUT; and means for measuring the reflected current from the DUT.

Means are provided for dividing the reflected voltage as a function of time from the DUT by the reflected current as a function of time from the DUT to provide the dynamic impedance for the point of the DUT being contacted with the probe.

A leakage testing circuit for measuring the effects of a test pulse includes a third switch S3 having a first terminal connected to the DUT and having a second terminal and a sense measuring unit (SMU) connected to the second terminal of the third switch S3 for providing a voltage and current to the DUT. Means are provided for initially opening the switch S2 to isolate the DUT from the transmission line. Means are provided for subsequently closing switch S3 to apply a voltage and current from the SMU to the DUT. Means are provided for determining the voltage and current from the sense measuring unit to determine the leakage current of the DUT.

The invention provides a method of testing integrated circuits with a discharge pulse and includes the steps off closing a first switch to charge a transmission line from a HV source; opening the first switch to isolate the transmission line from the HV source; closing a second switch to connect the charged transmission line to a DUT to provide a pulse from said transmission line; and measuring a reflected voltage and a reflected current from said DUT. The method further includes the steps of measuring the reflected voltage as a function of time and measuring the reflected current as a function of time. A subsequent step includes dividing the voltage as a function of time by the current as a function of time to provide a dynamic impedance for the DUT.

The method further includes the steps of isolating the transmission line from the DUT; connecting a sense measuring unit (SMU to said DUT for providing a voltage and current to said DUT; and determining the voltage and current from the sense measuring unit to determine the leakage current of said DUT to determine the effect of the pulse on the DUT. The method includes the further step of dividing the reflected voltage as a function of time by the reflected current as a function of time to provide a dynamic impedance for the DUT.

The method of providing a discharge pulse for testing an integrated-circuit DUT includes the steps off connecting a wafer probe to a probe point on a DUT having integrated circuits formed thereon; connecting a first switch S1, having a first open position and a second closed position, in series with a HV terminal having a HV source connected thereto; connecting a second switch S2, having a first open position and a second closed position, in series with a transmission line having distributed capacitance and a DUT; connecting a third switch S3, having a first open position and a second closed position, in series with a leakage testing circuit including a third switch S3 having a first terminal connected to the DUT and having a second terminal connected to a sense measuring unit (SMU) for providing a voltage and current to said DUT; first, charging the transmission line having distributed capacitance by closing the first switch S1; then, opening the first switch S1 after the transmission line is charged; next, closing the second switch S2 to connect the charged transmission line to the DUT to provide a test pulse to the DUT; measuring the reflected voltage from the DUT as a function of time; and measuring the reflected current as a function of time.

The method further includes the step of dividing the reflected voltage as a function of time by the reflected current as a function of time to provide a dynamic impedance for the DUT. The method includes the step of first opening Switch S2 and then closing the third switch S3 to connect the SMU to the DUT, wherein the SMU includes a voltage source and a current measuring device, to determine the leakage current at said probe point subsequent to the test pulse being applied to the DUT to determine the effect of the test pulse on the DUT.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1A is a simplified equivalent circuit diagram of a prior art pulse generator circuit which uses the capacitance of a transmission line to store charge and which switches one terminal of the transmission line between two relay contacts which have a shunt capacitance therebetween.

FIG. 1B is a simplified equivalent circuit diagram of a prior art pulse generator circuit which uses the capacitance of a transmission line to store charge and which switches a DUT to the input terminal of a charged transmission line.

FIG. 2 is a simplified equivalent circuit diagram of a circuit for testing leakage current through a DUT, where the DUT is shunted with the resistance of a voltage measurement probe.

FIG. 3 is a circuit diagram of a transmission-line pulse discharge circuit and leakage test circuit, according to the invention.

FIG. 4 is timing diagram for operation of the circuit of FIG. 3.

FIG. 5 is a more detailed timing diagram of a portion of FIG. 4 showing formation of a discharge pulse in the transmission line pulse circuit according to the invention.

FIGS. 6A and 6B are timing diagrams showing discharge voltage and current waveforms for a system according to the invention.

FIG. 7 is a circuit diagram of a stress measuring unit (SMU) which provides a fixed voltage and measures leakage current.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 1A is a simplified diagram of an equivalent circuit 10 of a prior art pulse generator circuit which uses the capacitance 12 of a transmission line to store charge and which uses the distributed inductive and capacitive elements of the transmission line to generate a pulse. One conductor of the transmission line, which is represented as a capacitor, is connected to a ground terminal 14. The other conductor of the transmission line is connected to the switch-arm terminal 16 of a relay. The relay has two contacts 18, 20. The contacts have a small shunt capacitance $C_x$ between them. The relay contact 18 has a high voltage source 24 connected through it through a series resistance 26. When the relay switch arm is connected between terminal 16 and 18, the high voltage source 24 charges the capacitance 12 of the transmission line through the series resistor 26 to the value of the high voltage supply 24. When the relay is switched so that the switch arm of the relay provides connection between terminal 16 and the relay contact 20, the charge stored on the capacitance 12 of the transmission line is discharged from the line into a Device Under Test (DUT) 28. A DUT is typically an integrated-circuit. For the recharge transient problem associated with this type of circuit, when the capacitance 12 of the transmission line is switched between the high voltage source 24 and the DUT 28, the small shunt capacitance 22 between the two relay contacts 18, 20 allows a displacement current to travel to the DUT 28. This displacement current is given by $I_x(t)=C_x \, dv/dt$, where $C_x$ is the small shunt capacitance across the two relay contacts. The effect of this displacement current is to put an uncontrolled amount of electrical stress on the DUT, which skews the effect of a subsequent test pulse from the transmission-line pulse generator.

FIG. 1B is a circuit diagram of a prior art pulse generator circuit 30 which uses the capacitance of transmission line 32 having a length l to store charge. For a co-axial transmission line 32, the outer conductor 34 is connected to a ground terminal. The center conductor 38 of the transmission line has one end connected through a 10 Megohm resistor 40 to the positive terminal of a voltage source 42. The negative terminal of the voltage source 42 is connected to the ground terminal of the circuit. The other end of the center conductor 38 of the transmission line 32 is connected to the cathode terminal of a series diode 44. The anode terminal of the series diode 44 is connected through a load resistor circuit 46 to the ground terminal. The diode 44 provides a unipolar test pulse. The load resistor 46 matches the impedance of the transmission line 32.

FIG. 2 shows a diagram for a simplified equivalent circuit 50 for forcing a test voltage on a DUT 52 from a Sense Measurement Unit (SMU) 54. The positive terminal of the SMU 54 is connected through a line 56 to the DUT 52. The negative terminal of the SMU 54 is connected to ground potential and the other terminal of the DUT 52 is connected to ground potential. A relatively high input impedance voltage probe is used to measure the voltage across the DUT 52. The voltage probe includes a 10 Megohm series resistance 58 which is shunted across the DUT 52 and across the positive terminal of the SMU 54 and the ground reference potential. A leakage current $I_1$ flows through the DUT 52 and is measured by the SMU 54. A shunt current $I_2$ flows through the shunt resistance 58 of the voltage probe. The SMU provides a constant voltage and measures the leakage current through the DUT and the voltage probe. If the resistance of the DUT 52 is much greater than the resistance 58 of the voltage probe, more current $I_2$ will flow through the lesser resistance of the voltage probe than will flow through the higher resistance of the DUT. As a result, the current $I_2$ flowing through the voltage probe resistance 58 will mask the leakage current $I_1$ through the DUT.

FIG. 3 shows an improved transmission line pulser discharge circuit 100, according to the invention. To avoid the recharge transient problem associated with the shunt capacitance across the contacts of a relay and to avoid the leakage problem associated with the voltage probe, three separate switches, such as the relays S1, S2, and S3, are used in predetermined sequences. Each of the switches S1, S2, S3 includes a switch arm and a single contact. A high voltage terminal 101 is adapted to having a high voltage source connected to it. A 10 Megohm series resistor 102 is connected between the terminal 100 and a single contact 104 of the switch S1. The switch arm of S1 is connected to a terminal 106. The terminal 106 is connected to a reference terminal, or point, A of the circuit. Terminal A is connected to the center conductor 108 of a transmission line, such as the co-axial transmission line 110. The transmission line 110 has an outer conductor 112 connected to a ground reference potential. The center conductor 108 of the transmission line 110 is also connected to the cathode terminal of a diode 114 which has its anode terminal connected to one terminal of a series termination resistor 116. The other terminal of the series termination resistor 116 is connected to the ground reference potential. The termination resistor 116 matches the characteristic impedance of the transmission line 110, which has a length l forming a pulse with a width equal to 2 l/c. A conductor 120 is connected between reference terminal A and reference terminal B, as indicated in the Figure. A measurement of the voltage V between the terminal A and the ground reference potential is taken between terminals 122 and 123. This measurement is taken, for example, with a measuring instrument 124, such as, for example, an oscilloscope or a time domain reflectometry (TDR) piece of measurement equipment. Measurement of the current passing through the conductor 120 is obtained with a current-sensing coil 126 wound around the conductor 120, as indicated in the Figure. The current is measured by the voltage induced between test terminals 128, 130. The current is measured, for example, using a oscilloscope or a time domain reflectometry (TDR) piece of measurement equipment. The voltage and current measurements include both incident and reflected voltage and current waveforms.

The reference terminal B is connected to a terminal 132, which is connected to the switch arm of switch S2. A contact terminal 134 of the switch S2 is connected to a reference terminal C as shown in the Figure. Terminal C is connected to a signal line 136 which is connected to an input terminal 138 of a wafer probe 140 assembly. The wafer probe assembly 140 includes a probe tip 142 which is connected to the input terminal 138 of the probe 140. Electrical contact with the pulser circuit is made with the probe tip 142 to point on a Device Under Test (DUT), such as a semiconductor wafer 144. The probe tip 148 of another wafer probe 146 provides a ground connection between a ground conductor and a ground reference terminal 150.

Terminal C is also connected to the contact terminal 152 of the switch S3. The moveable arm of the switch S3 is connected to a terminal 154 of the switch S3. The terminal 154 is connected to the positive terminal 156 of a Sense Measurement Unit (SMU) 158. The negative terminal of 160 of the SMU 158 is connected to a ground reference potential. The SMU provides, for example, a forced constant voltage at its positive terminals and includes a current sensing unit for measuring current.

In operation, the switches S1, S2, and S3 are operated in a certain sequence by a suitable controller 170, such as a microcomputer, a digital logic circuit, or a similar sequence controller, for pulse testing a wafer 144. For charging the capacitance of the transmission line 110, the relay contacts of S1 are closed while the relay contacts of relays S2, S3 are both open. For discharging the charge on the transmission line 110 to form a test pulse, the relay S1 contacts are first opened, and the relay contact S2 is then closed while the relay contact S3 is open.

After each test pulse is generated and applied to a wafer, the condition of the wafer is determined by a leakage current measurement. The relay contact S2 is opened to isolate the pulse generator circuit and then the relay contact S3 is closed. The condition of the relay contact for relay S1 is irrelevant because it is isolated by the open switch S2.

FIG. 4 shows a timing chart for a transmission-line charge interval $T_0$, a discharge interval $T_1$, and a leakage measurement interval $T_2$. The Figure shows that settling times are provided between the intervals to allow settling of the relays and to maintain controlled isolation between the various circuit components connected to the relays. In the Figure, a closed condition is indicated by a high signal and a closed condition is indicated by a low signal. During the charge interval $T_0$, relay S1 is closed and relays S2 and S3 are open. Near the end of the charge interval $T_0$, the relay S1 is also opened. This prevents displacement current from flowing and stressing the DUT in an uncontrolled manner. During the discharge interval $T_1$, switches S1 and S2 remain closed, while relay S2 closes to allow the charge on the transmission line to discharge into the DUT 144. During the leakage test interval $T_2$, both relays S1 and S2 are open and relay S3 is closed. Relay S2 being open isolates the SMU 158 and the wafer 144 from the other circuitry. The intervals $T_0$, $T_1$ and $T_2$ are much greater than the corresponding relay response times. The response times are indicated by the finite transition times between the open and close conditions of each of the relays.

FIG. 5 is a more detailed timing diagram showing formation of a discharge pulse and a transmission line pulse forming circuitry during the discharge time $T_1$. The relay S2 goes from an open condition at time 200 to a closed condition at time 202. The second line of the figure shows that the amplitude of the discharge pulse is formed beginning at time 204. A pulse 206 with a width, for example, of approximately 150 nanoseconds is provided. The diode 114 prevents a negative portion of the pulse from being formed.

FIG. 6A shows the voltage wave form at reference terminal A as a function of time. An incident voltage pulse $E_i$ has a magnitude of 250 volts. A reflected voltage pulse $E_r$ is reflected back from the DUT. FIG. 6B shows the current wave form measured by the current measuring coil 126. An incident current $I_i$ is followed by a reflective current $I_r$ with an amplitude of 5 ampere. These measurements are taken for the condition where the output resistance is less than the characteristic impedance of the transmission line. The absolute value of the current and voltage reflection coefficients are the same. To find the dynamic impedance as a function of time for the DUT 144, the reflected voltage as a function of time is divided by the reflected current as a function of time, where the reflected voltage and reflected current are functions of time. This division is accomplished with, for example, an A/B input function for the display mode of an oscilloscope.

FIG. 7 is a circuit diagram showing the equivalent circuit for a Sense Measuring Unit (SMU) which is used for measuring leakage current and avoiding use of a voltage probe. The SMU is switched into the circuit after a test pulse is applied to the DUT with relay S3 isolated from the pulse-forming elements of the circuit by relay S2. SMU's are provided by Keithly Instruments Company and Hewlett Packard Corporation. A typical SMU is the Hewlett Packard HP4145 Semiconductor Parametric Analyzer. This device can provide a forced voltage level and a current meter, as indicated in the Figure. The leakage of the DUT subsequent to a pulse being provided to the DUT is used to determine the effect of the test pulse on the condition of the DUT.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the Claims appended hereto and their equivalents.

I claim:

1. A pulse discharge circuit for pulse testing an integrated-circuit device under test (DUT), comprising:

a first switch having a closed position for connecting a high voltage source to a first terminal of a transmission line and providing a conductive path for charging the transmission line to a charged state;

said first switch having an open position for electrically isolating the high voltage source from the first terminal of the charged transmission line;

a second switch having an open position for electrically isolating an integrated circuit DUT from the first terminal of the transmission line, said second switch having a closed position for connecting the charged transmission line, which is isolated from the high voltage source by the first switch, to the integrated-circuit DUT and providing a pulse to said DUT from the charged transmission line;

means for measuring the reflected voltage and reflected current from said DUT at the first terminal of the transmission line.

2. The system of claim 1 including means for subsequently testing leakage of the DUT subsequent to a pulse being provided to the DUT to determine the condition of the DUT.

3. The system of claim 2 wherein the means for subsequently testing leakage of the DUT includes:

said second switch in an open position for isolating the transmission line from the DUT;

a third switch which provides means for connecting a sense measuring unit (SMU) to said DUT wherein said SMU provides a voltage and a current to said DUT;

means for determining the voltage and current from the sense measuring unit to determine the leakage current of said DUT.

4. The system of claim 3 wherein the means for connecting the sense measuring unit (SMU) to said DUT includes setting the third switch in a closed position.

5. A pulse discharge system for testing an integrated-circuit device under test (DUT), comprising:

a HV terminal adapted to having a high voltage source connected thereto;

a series resistor connected in series with said HV terminal;

a first switch S1, having a first terminal connected in series with said series resistor and having a second terminal;

a second switch S2, having a first terminal coupled to the second terminal of the first switch and having a second terminal connected through a probe to a first terminal of a DUT;

a transmission line having a first terminal connected to the second terminal of said first switch S1 and having a second terminal connected to a ground potential;

a controller including means for opening the second switch S2 to isolate the DUT from the transmission line;

said controller including means for closing the first switch S1 to charge the transmission line from the HV source, and including means for opening the first switch S1 to isolate the HV terminal from the transmission line;

said controller including means for closing the second switch S2 to connect the charged transmission line to the probe to provide a discharge pulse to the DUT;

voltage sensor means coupled to the first terminal of said transmission line for measuring any reflected voltage which propagates from the DUT as a result of the pulse applied to the DUT;

current sensor means coupled to the first terminal of said transmission line for measuring any reflected current which propagates from the DUT as a result of the pulse applied to the DUT.

6. The system of claim 5 including means for dividing the measured reflected voltage as a function of time from the DUT by the measured reflected current as a function of time from the DUT to provide dynamic impedance for the point of the DUT being contacted with the probe.

7. The system of claim 5 including a leakage testing circuit including a third switch S3 having a first terminal connected to the first terminal of the DUT and having a second terminal;

a sense measuring unit (SMU) connected to said second terminal of said third switch S3 for providing a voltage and current to said DUT;

controller means for initially opening the switch S2 to isolate the DUT from the transmission line;

said controller means including means for subsequently closing switch S3 to apply a voltage and current from said SMU to said DUT;

means for determining the voltage and current from the sense measuring unit to determine the leakage current of said DUT.

8. A method of testing integrated circuits with a discharge pulse, comprising the steps of:

closing a first switch S1 connected between a HV source and a transmission line to charge a transmission line from a HV source;

opening the first switch to isolate the charged transmission line from the HV source;

closing a second switch S2 connected between the transmission line and a DUT to connect the charged transmission line to the DUT to provide a pulse to the DUT from said transmission line; and measuring a reflected voltage and a reflected current from said DUT in response to the pulse provided to the DUT from said transmission line.

9. The method of claim 8 including the steps of
measuring the reflected voltage as a function of time;
measuring the reflected current as a function of time.

10. The method of claim 8 including the step of dividing the reflected voltage as a function of time by the reflected current as a function of time to provide a dynamic display impedance for said DUT on an oscilloscope receiving signals indicative of the reflected voltage and reflected current.

11. The method of claim 8 further including the steps of:

isolating the transmission line from the DUT by opening the second switch;

connecting a sense measuring unit (SMU) to said DUT for providing a voltage and current to said DUT; and determining the voltage and current from the sense measuring unit to determine the leakage current of said DUT to determine the effect of the pulse on said DUT.

12. A method of providing a discharge pulse for testing an integrated-circuit DUT, comprising the steps of:

connecting a wafer probe to a point on a DUT having integrated circuits formed thereon;

connecting a first switch S1, having a first open position and a second closed position, in series with a HV terminal having a HV source connected thereto;

connecting a second switch S2, having a first open position and a second closed position, in series with a transmission line having distributed capacitance and a DUT;

connecting a third switch S3, having a first open position and a second closed position, in series with a leakage testing circuit wherein the third switch S3 has a first terminal connected to the DUT and a second terminal connected to a sense measuring unit (SMU) for providing a voltage and current to said DUT from said sense measuring unit;

first, charging the transmission line having distributed capacitance by closing the first switch S1;

then, opening the first switch S1 after the transmission line is charged;

next, closing the second switch S2 to connect the charged transmission line to the DUT to provide a test pulse to the DUT;

measuring the reflected voltage from the DUT as a function of time;

measuring the reflected current as a function of time.

13. The method of claim 12 including the step of dividing the reflected voltage as a function of time by the reflected current as a function of time to provide a dynamic impedance for the DUT.

14. The method of claim 12 further including the step of first opening Switch S2 and then closing the third switch S3 to connect the SMU to the DUT, wherein the SMU includes a voltage source and a current measuring device, to determine the leakage current at said probe point subsequent to the test pulse being applied to the DUT to determine the effect of the test pulse on the DUT.

* * * * *